(12) United States Patent
Guzman et al.

(10) Patent No.: US 6,398,373 B1
(45) Date of Patent: Jun. 4, 2002

(54) PNEUMATIC CONTROL SYSTEM AND METHOD FOR SHAPING DEFORMABLE MIRRORS IN LITHOGRAPHIC PROJECTION SYSTEMS

(75) Inventors: Andrew J. Guzman, Danbury; Carlo La Fiandra, Wilton; Ronald P. Sidor, Stratford; Jorge S. Ivaldi, Trumbull; Michael L. Nelson, West Redding, all of CT (US)

(73) Assignee: ASML US, Inc., Wilton, CT (US)

( * ) Notice: Subject to any disclaimer, the term of this patent is extended or adjusted under 35 U.S.C. 154(b) by 0 days.

(21) Appl. No.: 09/635,984

(22) Filed: Aug. 9, 2000

(51) Int. Cl.[7] .............................. G02B 5/08; G02B 7/182
(52) U.S. Cl. ...................... 359/846; 359/849; 359/900
(58) Field of Search ................................ 359/846, 849, 359/290, 291, 223, 224, 847, 848, 900, 838; 250/201.9

(56) References Cited

U.S. PATENT DOCUMENTS

| 4,059,346 A | * | 11/1977 | Levine et al. ............... 359/847 |
| 4,492,431 A | * | 1/1985 | Eitel et al. ................... 359/849 |
| 4,726,671 A | * | 2/1988 | Ahmad et al. ............... 359/848 |
| 4,775,230 A | * | 10/1988 | Meier ........................... 359/849 |
| 4,959,531 A | * | 9/1990 | Marino ........................ 359/849 |
| 5,151,809 A | * | 9/1992 | Meier ........................... 359/849 |
| 5,204,784 A | * | 4/1993 | Spinhirne .................... 359/849 |
| 5,357,825 A | * | 10/1994 | Costello et al. ............. 359/849 |
| 5,434,697 A | * | 7/1995 | Ameer ......................... 359/849 |
| 5,535,043 A | * | 7/1996 | La Fiandra et al. ......... 359/849 |
| 5,896,228 A | * | 4/1999 | Inoue et al. ................. 359/223 |
| 5,907,441 A | * | 5/1999 | Sapy ............................ 359/846 |
| 5,986,795 A | * | 11/1999 | Chapman et al. ........... 359/846 |

FOREIGN PATENT DOCUMENTS

| DE | 3521973 C1 | * | 7/1986 | ................. 359/846 |
| GB | 1060662 | * | 3/1967 | ................. 359/849 |

OTHER PUBLICATIONS

W.D. Henderson, et al., "System performance of a large deformable mirror using differential ball screw actuators", SPIE vol. 179, Adaptive Optical Components II, pp. 51–60, (1979).*

* cited by examiner

Primary Examiner—Cassandra Spyrou
Assistant Examiner—John Juba Jr.
(74) Attorney, Agent, or Firm—Sterne, Kessler, Goldstein & Fox, pllc

(57) ABSTRACT

A system for adjusting a deformable mirror including a reaction plate, a plurality of pneumatic actuators coupled to the reaction plate, and a plurality of push-pull flexures coupled on a first end to the pneumatic actuators, and coupled on a second end to the non-reflective side the deformable mirror, the plurality of push-pull flexures being disposed at various locations on the back of the deformable mirror. The respective pairs of push-pull flexures and pneumatic actuators are operated to support and alter the shape of the deformable mirror to allow for correction of a plurality of optical aberrations.

13 Claims, 6 Drawing Sheets

FIG 4A  Actuator Sequences for Z5 Mirror Bending
Scenario 1
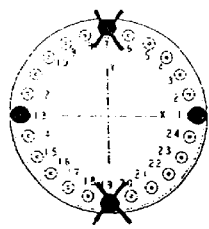
Scenario 2
All 24 actuators of varying magnitude forces
Scenario 3
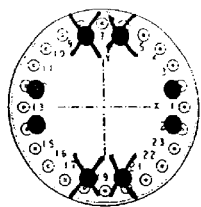
Scenario 4
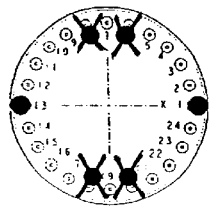
Scenario 5
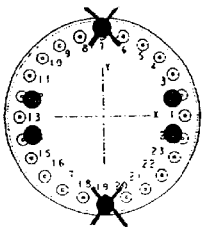
FIG 4B  Actuator Sequences for Z6 Mirror Bending
Scenario 1
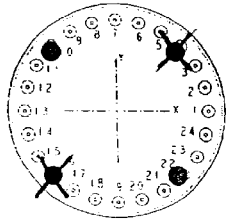
Scenario 2
All 24 actuators of varying magnitude forces
Scenario 3
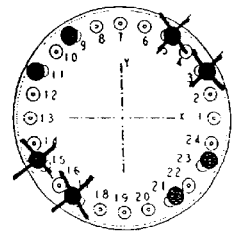
Scenario 4
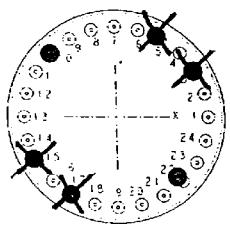
Scenario 5
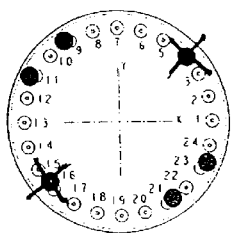

FIG 4C  Actuator Sequences for Z9 Mirror Bending
Scenario 1
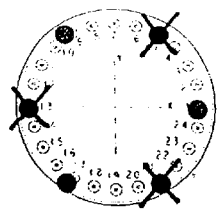
Scenario 2
All 24 actuators
of varying
magnitude forces
Scenario 3
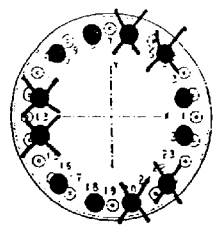
Scenario 4
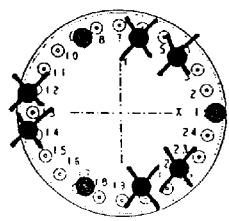
Scenario 5
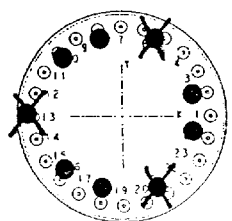
FIG 4D  Actuator Sequences for Z10 Mirror Bending
Scenario 1
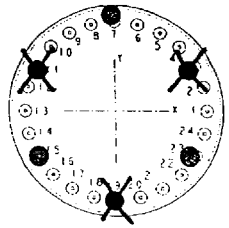
Scenario 2
All 24 actuators
of varying
magnitude forces
Scenario 3
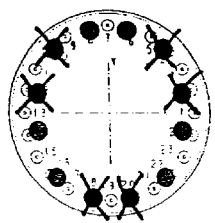
Scenario 4
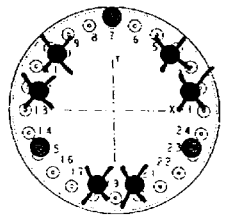
Scenario 5
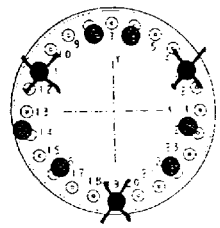

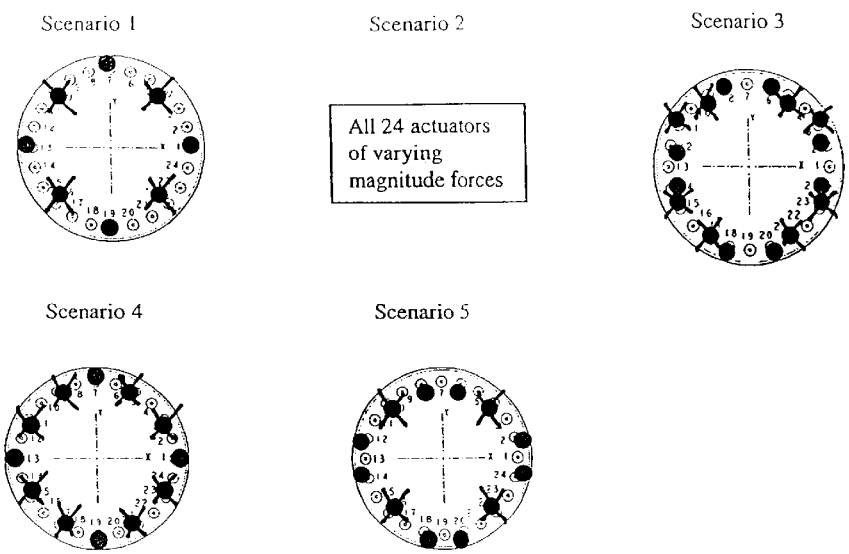
FIG 4E Actuator Sequences for Four-Leaf Clover Bending Oriented at 0 Degrees

PNEUMATIC CONTROL SYSTEM AND METHOD FOR SHAPING DEFORMABLE MIRRORS IN LITHOGRAPHIC PROJECTION SYSTEMS

BACKGROUND OF THE INVENTION

1. Field of the Invention

The present invention relates generally to photolithographic optical systems used in semiconductor manufacturing, and more particularly to systems for shaping deformable mirrors within such optical systems.

2. Related Art

Semiconductor devices are usually manufactured using photolithographic techniques. As the demand for ever smaller semiconductor devices has increased, so has the need for ever more precise photolithographic techniques. A crucial element of the photolithographic technology is the optics system.

Today, photolithographic optics systems have been pushed up almost against the physical limitations of the light they seek to manipulate and direct. Tolerances are typically measured in nanometers and this leaves little room for errors. For example, the simple heating or cooling of a mirror in an optics system by only a fraction of a degree, can have severe effects in the performance of the optics system. A substantial heat load is contributed by the absorption of exposure light in a photolithographic lens assembly. Other dynamic environmental factors that can affect system performance are humidity, and barometric pressure. Static errors can also be introduced into these complex systems. Examples of static errors are defects in the mirror itself such as defects introduced by polishing or by minute shape variations. As a result of these potential errors, more inventive and precise ways to compensate for minute environmental and static variations are needed.

In addition to the demand for increasing precision and decreasing size, the semiconductor manufacturing industry has also experienced an ever increasing need for volume. For this reason, photolithographic technology must also be robust enough to stand up to the demands of the manufacturing process. Problems or delays in any part of the process can have serious effects on a companies ability to meet demand.

Therefore, there is a need for precise optical systems, with the ability to dynamically compensate for system aberrations introduced by static errors, environmental variations, or absorption of the exposure light, that can also withstand the rigors of a mass production environment. Our contribution to the art is a precise, robust system to shape a deformable spherical mirror, allowing for correction of various optical aberrations.

A deformable mirror capable of being dynamically adjusted is known in the prior art. See, for example, European patent application EP 0 961 149 A2 entitled "Catadioptric Objective for Projection with Adaptive Mirror and Projection Exposure Method" to Carl Zeiss, which is herein incorporated by reference. Therein disclosed is a deformable mirror with a few independent actuators (two in the preferred embodiment). It is therein described as advantageous to have a small number of actuators. The specific design of actuators themselves is not disclosed.

Another similar system is disclosed in U.S. Pat. No. 5,142,132, entitled "Adaptive Optic Wafer Stepper Illumination System" issuing Aug. 25, 1992, to MacDonald et al., which is also incorporated herein by reference. Therein disclosed is an optical system containing deformable mirror, in which the deformable mirror is capable of being shaped by a plurality of actuators.

The current invention distinguishes itself from the prior art as being an apparatus and method of carrying out the actual deformation, or shaping, of a deformable mirror. The invention combines the precision necessary in the art, with the robustness required by the manufacturing world.

SUMMARY OF THE INVENTION

The present invention comprises a robust system to dynamically adjust the shape of deformable mirrors in photolithographic tools. Optical performance is improved, and the invention is robust enough to sustain multiple individual component failures without decreasing effectiveness.

The invention uses a system of a plurality of pneumatic actuators, placed approximately equidistantly around the perimeter of a deformable mirror, to dynamically correct transmitted wavefront aberrations. The pneumatic actuators make use of a cantilevered arm to gain mechanical advantage. This allows for a greater number of smaller actuators thereby realizing both increased robustness and greater control of the deformable mirror as compared to the prior art.

The invention is intended to correct a plurality of different wavefront distortions. More specifically, astigmatism, three-leaf clover, and four-leaf clover aberrations of any orientation are correctable using the present invention. It is designed to accomplish this correction in such a manner so as to minimize any residual errors that may be imparted to the system. The configuration of the system can accommodate correction of other aberrations as well, and is not limited to the five aberrations mentioned.

Accordingly, it is an object of the present invention to provide a precise and robust system for dynamically adjusting a deformable mirror in an optics system in order to enhance overall optical performance.

It is an advantage of the present invention that the use of a plurality of actuator sets incorporates bending modes with redundant actuation capability enabling continued use with some individual actuator failure.

It is another advantage of the present invention that the pneumatic actuator sets are operated in a self reacting configuration that results in a zero net force and zero net moment being transmitted at the systems boundaries.

It is another advantage of the present invention that the pneumatic actuators use a lever to gain mechanical advantage, which allows a greater number of smaller actuators to provide both greater redundancy and increased control over the deformable mirror. Such actuators are also useful to deform thick mirrors.

It is another advantage of the present invention that the system is easily assembled without inducing any stress or strain into the system.

It is another advantage of the present invention that the pneumatic actuators are easily replaced without inducing any stress or strain into the system, and without affecting the shape of the mirror.

It is yet another advantage of the system that wide manufacturing tolerances are accommodated.

It is yet another advantage of the invention that the configuration of the actuators can correct for arbitrary linear combinations of aberrations from the selected wavefronts.

It is yet another advantage of the invention that the use of non-heat producing actuators eliminates any system thermal disturbances that can be imparted by prior art systems.

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

FIGS. 4A–4E depict a plurality of balanced actuator sequences used in correcting specific optical aberrations according to the present invention.

DETAILED DESCRIPTION OF THE PREFERRED EMBODIMENTS

The present invention provides a robust system to dynamically adjust the shape of deformable mirrors in photolithographic tools. While the invention is of general applicability, it will be described for purposes of example as it is applied to a spherical mirror in a catadioptric optical reduction system similar to that described in U.S. Pat. No. 5,537,260, which is incorporated herein by reference. It is not intended that the invention be limited to the application in this sample environment. In fact, after reading the following description, it will become apparent to a person skilled in the relevant art how to implement the invention in alternative environments known now, or developed in the future. The present invention will be described first physically and then operationally.

Physically, the invention will first be described as it is typically situated in its housing in the projection optics box of a catadioptric optical reduction system. Then the individual components of the invention, their coupling, and their distinguishing characteristics will be described.

Operationally, the invention will be described in terms of how the shape of the mirror is adjusted to correct for various optical aberrations.

Physical Description

Figure 1:
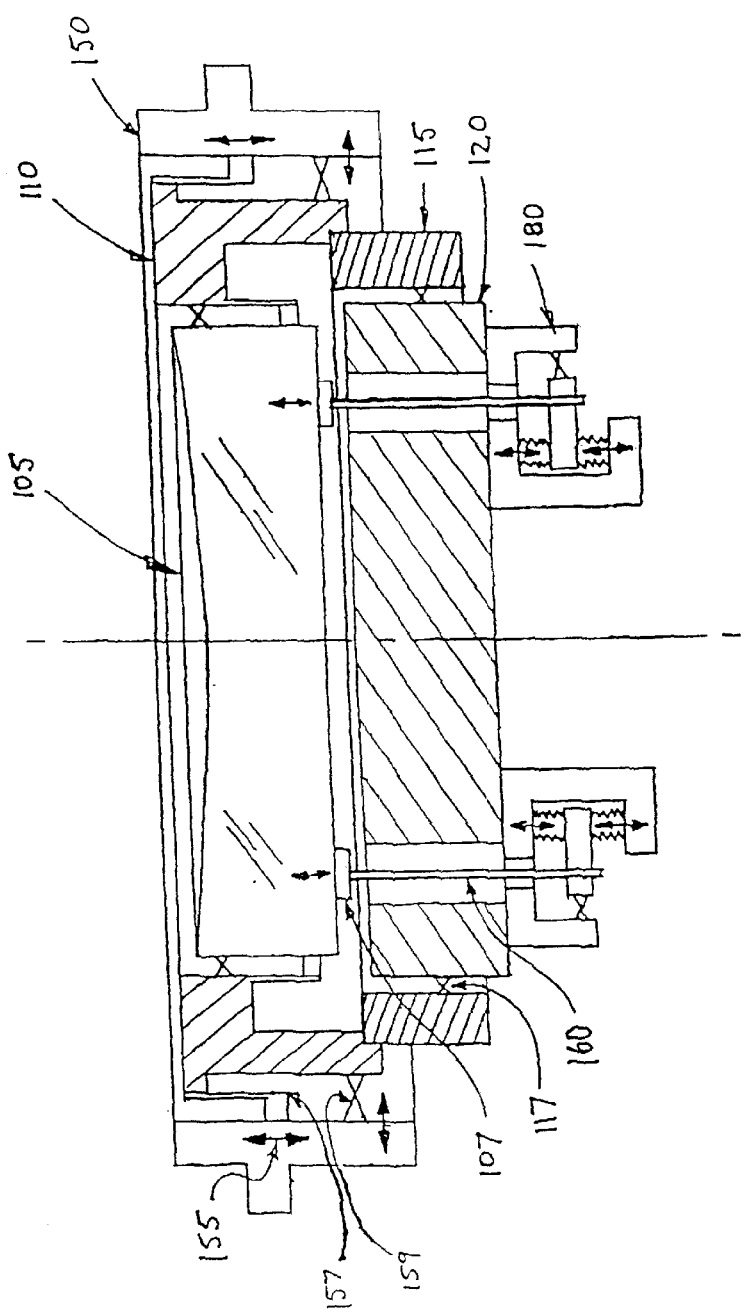
FIG. 1 is an overall apparatus schematic diagram illustrating a deformable mirror and plurality of actuators according to the present invention.
Figure 3:
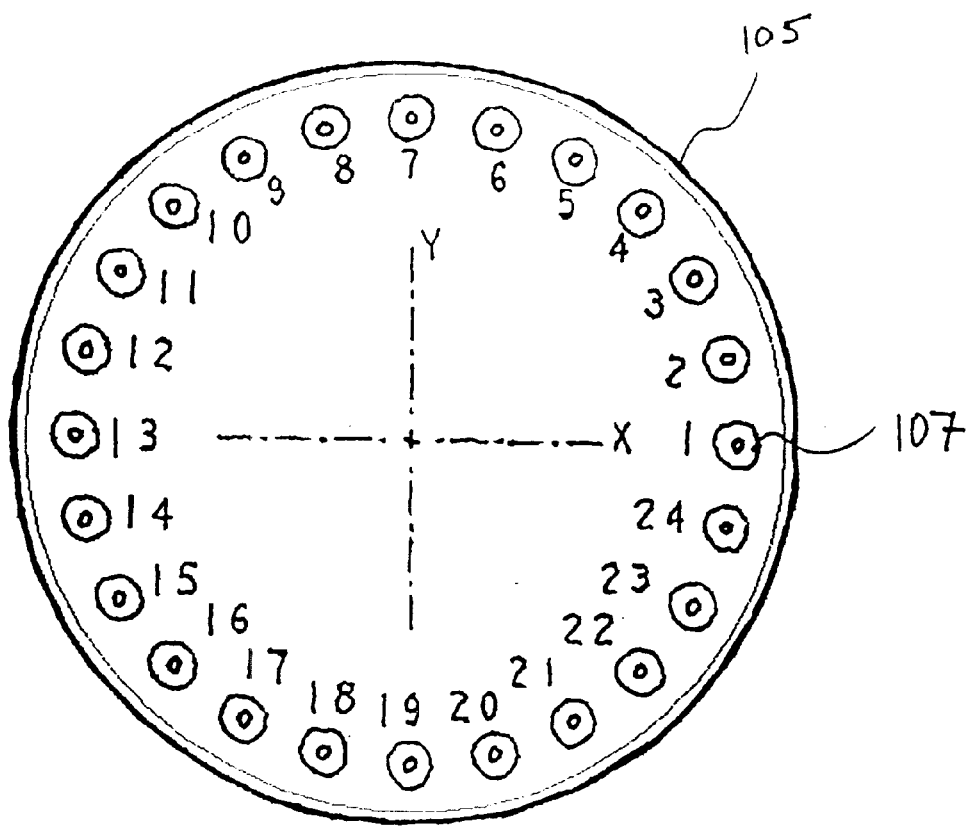
FIG. 3 depicts the mirror button and actuator configuration according to the present invention.

FIG. 1 depicts an overall apparatus schematic diagram to more easily convey design concepts. A deformable spherical mirror 105 (the mirror) is a mirror with a concave reflective surface supported by a deformable slab with a flat, non-reflective back. FIG. 3 depicts the contact points, called mirror buttons 107, which are disposed around the perimeter of the non-reflective back of the mirror. The present invention is a robust and precise system for applying pressure to these mirror buttons 107 in a manner that allows correction of various optical aberrations.

In accordance with the present invention, the mirror 105 is mounted on three independent subassemblies: (a) an inner ring 110, (b) a reaction assembly consisting of a reaction plate ring 115 and reaction plate 120, and (c) an outer ring 150. Each of these subassemblies has its own set of axial and tangential flexure supports. The mirror 105 is supported with a first set of tangential and axial flexures fixed to the inner ring 110. The reaction assembly (reaction plate ring 115 and reaction plate 120) is then guided into this inner ring 110. The inner ring 110 and reaction assembly 115 and 120, which are mated together, are both further supported by an outer ring 150. The outer ring tangential and axial flexures, 157 and 159, are adjustable. Adjusting these outer ring flexures permits optical alignment of the mirror in the "Z" plane as represented by arrow 155. An example of a conventional mounting configuration is one used in the Micrascan III tool, manufactured by Silicon Valley Group, Inc., 901 Ethan Allen Hwy, Ridgefield, Conn. 06877.

In a preferred embodiment, the present invention is an integral part of the reaction assembly. The system for adjusting the shape of the mirror is fundamentally comprised of a plurality of axial flexures (push-pull flexures) 160, a corresponding plurality of pneumatic actuators 180, and the reaction plate 120.

The reaction plate 120 is a circular metal slab upon which the pneumatic actuators 180 are mounted. The pneumatic actuators 180 are disposed around the perimeter of the reaction plate 120 and on the opposite side of the mirror 105 they support. The reaction plate 120 has a set of tangential support flexures 117 of conventional design. The axial support of the reaction plate 120 is accomplished through pneumatic actuators 180. Thus, the reaction plate 120 is free to piston and tilt according to the forces and spring rates of the actuators 180 alone. Such a configuration guarantees a zero net force and moment transfer to the non-reflective side of the mirror 105. One skilled in the art will see appreciate a major advantage of such a configuration: that it mitigates piston and tilt of the mirror 105 due to force imbalance in the actuator force sets.

The push-pull flexures 160 are flexure rods that act upon the mirror buttons 107 on the non-reflective side of the mirror. The arrangement of the mirror buttons 107 is depicted in FIG. 3. The push-pull flexures 160 are coupled at one end to the mirror buttons 107 in a manner that allows force to be applied in two directions, pushing and pulling. Another configuration to the invention is the addition of actuators located in the interior of the existing ring of actuators.

At the other end, the push-pull flexure 160 is coupled to the pneumatic actuator 180. In a preferred embodiment, this coupling is achieved by a reversible epoxy bonding process, though equivalent coupling techniques can be used. The reversibility of the bond is crucial in that it allows for easy replacement of the pneumatic actuators 180 in the event of failure. The bond is reversed with heat, and replacement can thus be performed without affecting the shape of the mirror 105. It is also important to note that this bond is the last step of the assembly process. The spatial relationships between its component parts of the invention and the deformable mirror are first established. Then a predetermined dose of epoxy is introduced to the coupling between the cantilevered arm 260 and the push-pull flexure at 270. Lastly, the epoxy is allowed to solidify, thus establishing the mechanical link between the pneumatic actuator 180 and the deformable mirror 105 by way of the push pull flexure 160. This mechanical link is established in a stress free condition, thereby ensuring a zero net force at the boundaries of the deformable mirror 105.

Figures 2A, 2B:
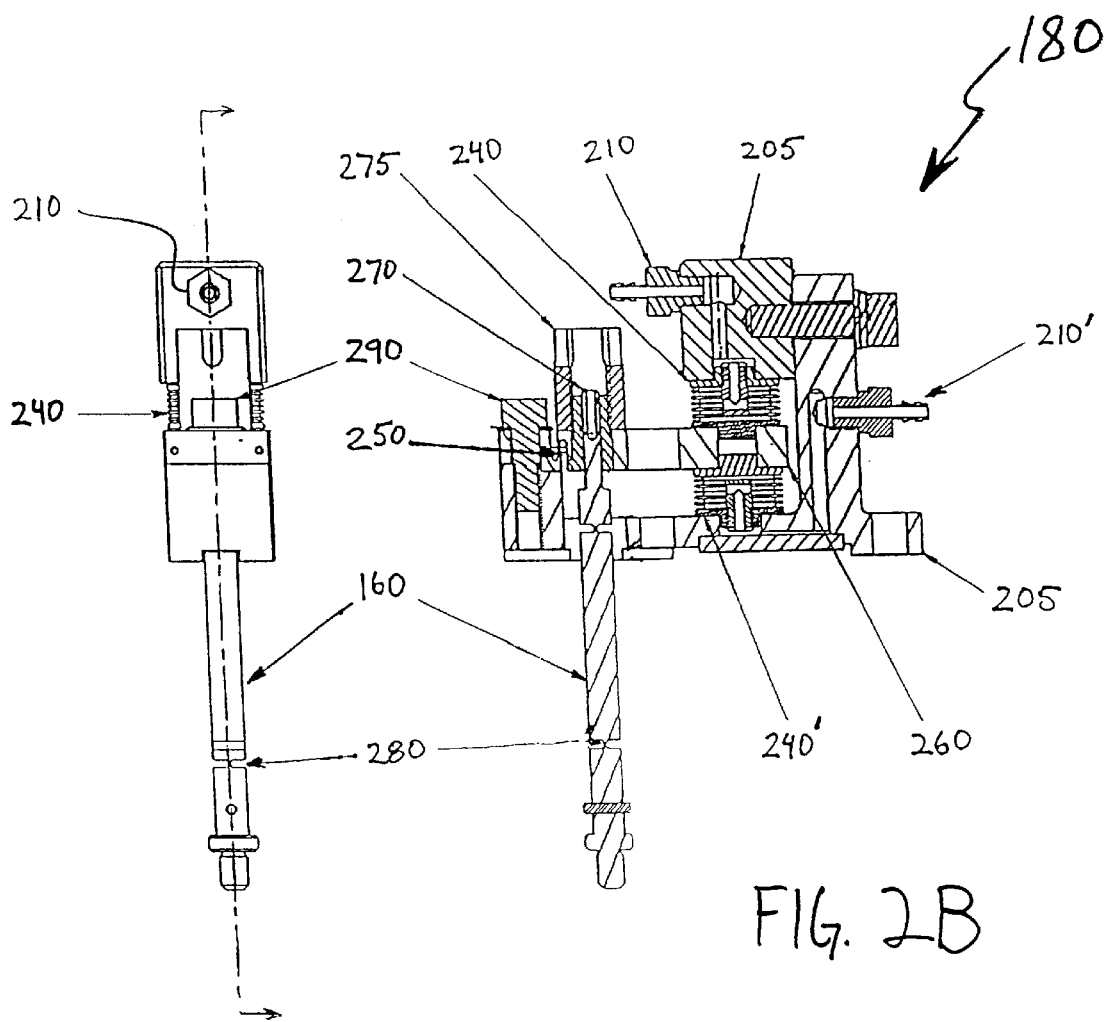
FIG. 2A is a view depicting an actuator front view according to the present invention.
FIG. 2B is a view of an actuator cross section according to the present invention.

There are several important characteristics of the push-pull flexure 160 itself. Each push-pull flexure 160 is designed with low lateral stiffness so as to only impart axial load on the mirror buttons. This is accomplished with the use of four blades constructed along the length of the rod. One such blade 280 is depicted in FIGS. 2A and 2B. The blades are oriented orthogonally. One skilled in the relevant art will see how this configuration allows high axial load, high buckling stability, yet has low lateral stiffness.

The pneumatic actuator 180 is an apparatus for applying pressure to the mirror buttons 107, via the push-pull flexures 160, on the non-reflective side of the mirror 105. As depicted in FIG. 2, the actuator is pneumatically operated and comprises a housing 205, a bellows set 240 and 240', a cantilevered arm 260, and a hinge 250. These elements are further described below.

The pneumatic actuators 180 are designed with the main purpose of imparting the proper force to the push-pull flexures 160 used to alter the shape of the mirror 105. In the current embodiment of the invention, the control air pressure operates in the range of 5–55 psi with a nominal pressure of 30 psi. The bellows are made of nickel and, as a pair, have a spring rate of less than 25 pounds per inch to withstand the operational pressure of the control gas without imparting unwanted reactions to the mirror 105.

Important features of the pneumatic actuator 180 include its small size, ease of replacement, and wide manufacturing tolerances. Because of its efficient and compact design, a larger numbers of actuators can be used on one mirror. A large number of actuators imparts, at a minimum, two distinct advantages over prior art. First, the larger number of actuators provides redundancy in the event of individual actuator failures. Second, the larger number of actuators provides added finesse in deforming the mirror and as a result, a larger number of aberrations may be more precisely corrected. The current embodiment of the invention is capable of 0.08 nanometer resolution over a range of about plus/minus 212 nanometers of correction to the wave front.

The housing 205 provides the structure for the pneumatic actuator. It directs the control gas to the bellows set 240, 240', supports the fulcrum and the cantilevered arm 260, and anchors the pneumatic actuator 180 to the reaction plate 120.

The cantilevered arm 260 is attached at one end to the housing 205 by the hinge 250. At the other end, the cantilevered arm 260 is supported by the bellows set 240, 240'. The push-pull flexure 160 is coupled to the actuator 180 at a point on the cantilevered arm 260 near the hinge 250. Thus, the force imparted to the cantilevered arm 260 by the bellows 240, 240' set is amplified when imparted to the push-pull flexure 160 by the levering action.

The bellows 240, 240' set translates the control gas pressure into motion of the cantilevered arm 260. Important factors in the design of the bellows include the size of the piston upon which the control gas acts, the material of the bellows and resulting spring rate. It is important that the spring rate be low such that the bellows are not imparting undue constraint to the mirror. At the same time, the bellows must be able to withstand the complete range of control pressures with no deformation or gas leakage. The bellows set is manufactured by Servometer Corp. of 501 Little Falls Road, Cedar Grove, N.J. 07009.

Operational Description

The present invention is capable of correcting a plurality of wavefront aberrations. In particular, the invention can correct astigmatisms, three-leaf-clover aberrations, and four-leaf-clover aberrations of any orientation. The configuration of the system can accommodate correction of other aberrations as well and is not limited to the five specific aberrations mentioned above. The present invention enables these corrections to be performed in a flexible, accurate, and robust manner. This manner is described below.

The pneumatic actuators 180 are numbered according to the mirror button 107 they support. This numbering scheme is depicted in FIG. 3. During system operation, e.g., by a computer-controlled closed-loop system, the pneumatic actuators 180 are moved in balanced sets. For example, actuators 1, 7, 13 and 19 comprise a balanced set. This is depicted in FIG. 4A, Scenario 1. Actuators 1 and 13 are disposed opposite each other, as are actuators 7 and 19. Actuators 1 and 13 would apply a tension force on the mirror (as denoted by a dark circle over the corresponding mirror buttons), while actuators 7 and 19 would apply a compression force (as denoted by the circles with X's over the corresponding mirror buttons).

Operation of the pneumatic operators 180 in balanced sets alters the shape of the mirror, but imparts zero net force across the boundaries of the mirror. That is, the net force and moment transmitted solely by the actuators onto the mirror back are zero. Such operation prevents rigid body shifting of the mirror, and retains the important optical alignment. If an actuator is moved that is not balanced, this has the effect of transferring load to the support assemblies. This has the potential to move the mirror relative to the mounts, and degrade the optical alignment.

A balanced set of actuators can contain from four actuators (see FIG. 4A Scenario 1), up to the total number of available actuators (FIG. 4A Scenario 2). To generate a plurality of corrections, various numbers of actuators can be used. The inventors have determined that 12 actuators or fewer can correct the 5 noted aberrations. The current invention allows for 24 or more actuators to be used in shaping the deformable mirror.

Each of Scenarios depicted in FIG. 4A through FIG. 4E is an example of a balanced actuator sequence. As shown, five different actuator sequences are used to perform each of the five specific optical aberrations denoted by Z5, 6, 9, 10, and 14. One skilled in the art will recognize that the present invention is not limited to the actuator sequences depicted in FIG. 4A through 4E. In fact, the present invention can be used to correct a plurality of optical aberrations in a similar fashion.

There is no need to specifically orient the buttons on the mirror to permit the invention to counter various optical aberrations. The numbering scheme of the mirror buttons, as depicted in FIG. 3, can be set in the computer control system after the mirror 105 is mounted in the support assembly.

The ability to place a large number of actuators on the mirror confers a number of important advantages to the present invention. Among these advantages are robustness of design, increased finesse in shaping the mirror, minimal residual errors imparted on the system, and more flexibility in the actual placement of the mirrors.

CONCLUSION

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A system for adjusting a deformable mirror, comprising:

a reaction plate;

a plurality of pneumatic actuators coupled to said reaction plate; and a plurality of push-pull flexures coupled on a first end to said pneumatic actuators, and coupled on a second end to the non-reflective side of said deformable mirror, said plurality of push-pull flexures being disposed at various locations on the back of said deformable mirror;

whereby said coupled push-pull flexures and pneumatic actuators are operated to support and alter the shape of said deformable mirror to allow for correction of a plurality of optical aberrations; and whereby said coupled push-pull flexures and pneumatic actuators are operated in sets, such that zero net force is realized across the boundaries of the deformable mirror.

2. The system of claim 1, wherein said reaction plate is supported tangentially by flexures, and receives axial support solely through said actuators coupled to said push-pull flexures and coupled to the non-reflective side of said deformable mirror, thereby resulting in zero net force and zero net moment being transmitted to the said non-reflective side of said deformable mirror.

3. The system of claim 1, wherein the deformable mirror is supported by a plurality of independent subassemblies, each subassembly comprising one of said plurality of pneumatic actuators and one of said plurality of push-pull flexures.

4. The system of claim 3, wherein each subassembly is coupled to said reaction plate.

5. The system of claim 1, wherein said pneumatic actuator comprises:

a housing;

a cantilevered arm;

a bellows set; and a hinge;

wherein a first end of said cantilevered arm is attached to said housing by said hinge, and a second end of said cantilevered arm is supported by said bellows set, said bellows set also being attached to said housing;

whereby the action of said bellows set on said cantilevered arm moves the attached push-pull flexure and imparts, with a mechanical advantage, a control force to the non-reflective side of the deformable mirror.

6. The actuator of claim 5, wherein said bellows set has a low spring rate.

7. The system of claim 1, wherein said push-pull flexure comprises orthogonally offset blades having high axial load capability high buckling stability, and low lateral stiffness; whereby only axial load is imparted to the mirror.

8. The system of claim 1, wherein the attachment of the push-pull flexure to the pneumatic actuator is the last step of the assembly process, whereby, after assembly, there is no change to the shape of the deformable mirror when compared to the original as-built shape of said deformable mirror, and whereby said pneumatic actuator is replaceable without inducing any net force on the deformable mirror.

9. The system of claim 8, wherein said attachment of the push-pull flexure to the pneumatic actuator is accomplished with a reversible bond, whereby said pneumatic actuator may be replaced without inducing any net force on the deformable mirror.

10. The system of claim 1, wherein said plurality of optical aberrations can be corrected with one or more of said plurality of pneumatic actuators deactivated.

11. A method of adjusting a deformable mirror, comprising the steps of:

providing a reaction plate;

coupling a plurality of pneumatic actuators to the reaction plate;

coupling a first end of each of a plurality of push-pull flexures to the non-reflective side of the deformable mirror; and coupling a second end of each of the plurality of push-pull flexures to a corresponding one of the plurality of pneumatic actuators, such that the plurality of push-pull flexures and corresponding pneumatic actuators are disposed at locations on the back of the deformable mirror;

whereby said plurality of push-pull flexures and corresponding pneumatic actuators are operated in sets, such that zero net force is realized across the boundaries of the deformable mirror.

12. The method of claim 11, further comprising the step of operating coupled push-pull flexures and pneumatic actuators in sets to alter the shape of the deformable mirror to correct at least one of a plurality of optical aberrations.

13. The method of claim 12, further comprising the step of deactivating one or more of the pneumatic actuators.

* * * * *